(12) United States Patent
Sheng et al.

(10) Patent No.: US 8,794,444 B2
(45) Date of Patent: Aug. 5, 2014

(54) LARGE-SIZED FRONT OPENING UNIFIED WAFER POD

(75) Inventors: Jain-Ping Sheng, New Taipei (TW);
Tzu-Jeng Hsu, Taipei (TW); Shao-Wei Lu, Taoyuan County (TW); Ming-Long Chiu, New Taipei (TW)

(73) Assignee: Gudeng Precision Industrial Co, Ltd, New Taipei (TW)

( * ) Notice: Subject to any disclaimer, the term of this patent is extended or adjusted under 35 U.S.C. 154(b) by 57 days.

(21) Appl. No.: 13/309,727

(22) Filed: Dec. 2, 2011

(65) Prior Publication Data

US 2013/0068656 A1 Mar. 21, 2013

(30) Foreign Application Priority Data

Sep. 20, 2011 (TW) .............................. 100133761 A

(51) Int. Cl.
*B65D 85/30* (2006.01)

(52) U.S. Cl.
USPC .......................................... 206/710; 206/454

(58) Field of Classification Search
USPC .................... 206/454, 710–712; 211/41.18
See application file for complete search history.

(56) References Cited

U.S. PATENT DOCUMENTS

| | | | | |
|---|---|---|---|---|
| 6,382,419 B1* | 5/2002 | Fujimori et al. | .............. | 206/454 |
| 7,201,276 B2* | 4/2007 | Burns et al. | .................. | 206/710 |
| 7,316,325 B2* | 1/2008 | Burns et al. | .............. | 211/41.18 |
| 7,347,329 B2* | 3/2008 | Burns et al. | .................. | 206/711 |
| 7,370,764 B2* | 5/2008 | Nyseth et al. | ................. | 206/711 |
| 7,669,717 B2* | 3/2010 | Sumi | ............................ | 206/710 |
| 7,789,240 B2* | 9/2010 | Yamagishi et al. | ........... | 206/710 |
| 8,047,379 B2* | 11/2011 | Chiu et al. | .................... | 206/711 |
| 8,365,919 B2* | 2/2013 | Nakayama et al. | ........... | 206/711 |
| 2002/0020650 A1* | 2/2002 | Fujimori et al. | .............. | 206/454 |
| 2010/0065467 A1* | 3/2010 | Murata | ......................... | 206/710 |
| 2011/0005966 A1* | 1/2011 | Chiu et al. | .................... | 206/711 |

* cited by examiner

*Primary Examiner* — Bryon Gehman
(74) *Attorney, Agent, or Firm* — Ming Chow; Sinorica, LLC

(57) ABSTRACT

A FOUP (front opening unified pod) is disposed with a plurality of supporting pieces, the positions of which are calibrated to be symmetrical for the supporting pieces to horizontally support wafers in the pod, and with an OHT pad (overhead hoist transport pad), a major function of which is to evenly distribute the weight of the FOUP and the wafers so that the transportation of the FOUP and the wafers by the OHT head can be further stabilized and more weight can be loaded to meet the demands of the process.

33 Claims, 13 Drawing Sheets

LARGE-SIZED FRONT OPENING UNIFIED WAFER POD

BACKGROUND OF THE INVENTION

1. Field of the Invention

The present invention is related to a front opening unified pod (FOUP), and more particularly, to the structure of a large-sized front opening unified pod. In the structure of the FOUP of the present invention, each supporting module is formed by a first material and is lock-fastened to the inner left side and the inner right side of the accommodation space in the large-sized FOUP and by a positioning frame formed by a second material; the upper side of the large-sized FOUP is further disposed with an overhead hoist transport pad (OHT pad) so that when the FOUP is joined with an overhead hoist transport head (OHT head), the OHT pad of high hardness can evenly distribute the lifting force exerted by the robot on the FOUP for the large-sized FOUP to be transported more stably.

2. Description of the Prior Art

The semiconductor process consists of multiple procedures or steps, and wafers are to be placed in different locations or different machines during these procedures or steps. Therefore, in the process, wafers need to be transported from one place to another and even stored for certain period of time as required by the process flow. Wherein, wafer cassettes function both as storage containers and transportation containers and need to be compatible with different types of transportation and carrying devices and thus play a very important role in the semiconductor process.

As shown in FIG. 1, in which is a conventional front opening unified pod (FOUP). The FOUP, usually formed by one-piece injection molding, has a container body A and the inner side of the container body A is disposed with a plurality of wafer supporting pieces B; the wafer supporting pieces B and the container body A can be formed by one-piece injection molding, or the container body A can be formed with a plurality of integrated sockets by one-piece injection molding and the wafer supporting pieces B are then snap-fitted into the integrated sockets.

However, as the size of wafers increases, to over 300 mm for example, the size of wafer containers also need to be increased. Yet when a large-sized wafer container is formed with injection molding using polymer material, the stress induced by the polymer material may cause distortion of the container body during its formation and may further lead to distortion of integrated wafer supporting pieces or sockets formed by one-piece injection molding; since the wafer supporting pieces or sockets are symmetrically disposed on left and right sides (for wafers to be horizontally placed in the container), slight distortion may lead to tilted position of wafers and affect the process and may even cause cracks in wafers and thus result in severe losses.

In addition, OHT system is usually used for carrying wafer containers, and an OHT head C (as shown in FIG. 1) is usually disposed on top of wafer containers to facilitate the robot in gripping and lifting wafer containers to other process platforms. The conventional OHT head C is usually lock-fastened with a plurality of lock-fasteners disposed at its center.

Loaded with large-sized wafers, a large-sized FOUP weighs heavier than a conventional small-sized FOUP. As the conventional OHT head C is only lock-fastened to the FOUP with a plurality of lock-fasteners and has to sustain the weight of the large-sized FOUP and of wafers within, distortion and cracks of the upper side of the FOUP may occur easily, and the OHT head C may break loose from the large-sized FOUP, which may fall down and be damaged and thus lead to a larger cost loss.

Moreover, as a large-sized FOUP is manually transported with its opening facing upward, when the FOUP is placed on a flat surface, weight of large-sized wafers in the FOUP may exert considerable impact when the FOUP and the surface are in contact and thus result in cracks or chipping of large-sized wafers in the FOUP.

SUMMARY OF THE INVENTION

In order to solve the aforementioned problems, one primary object of the present invention is to provide a front opening unified pod (FOUP) with wafer supporting pieces fastened via calibrated positioning frames, with which the supporting pieces in the FOUP can be symmetrical for wafers to be horizontally placed in the FOUP.

Another primary object of the present invention is to provide a front opening unified pod (FOUP) disposed with wafer supporting pieces lock-fastened to the container body formed by injection molding via calibrated positioning frames regardless of whether distortion of FOUP occurs or not, wherein the supporting pieces in the FOUP can be calibrated to be symmetrical for horizontally supporting wafers placed in the FOUP, which results in the increase of yield of the FOUP process and the reduction of manufacturing cost of FOUP.

Still another primary object of the present invention is to provide an overhead hoist transport pad (OHT pad) of high hardness that is disposed between a front opening unified pod (FOUP) and an overhead hoist transport head (OHT head), wherein when the FOUP and the OHT head are joined with each other, the OHT pad of high hardness can evenly distribute the lifting force exerted by the robot on the FOUP for the FOUP to be transported more stably.

Yet another primary object of the present invention is to provide an overhead hoist transport pad (OHT pad) of high hardness that is integrated with the upper side of the FOUP via embedded injection molding and directly joined with the overhead hoist transport head (OHT head) so that the OHT pad of high hardness can evenly distribute the lifting force exerted by the robot on the FOUP for the FOUP to be transported more stably.

According to the objects above, the present invention provides a FOUP comprising a container body composed of left side, right side, upper side, and lower side joined together with rear side, an opening opposite to the rear side, and a door sized to correspond to the size of the opening and to close the opening, wherein the characteristic of the FOUP is in that: a plurality of first through holes are formed on the left and right sides of the container body near the front and the rear ends, a plurality of positioning frames are formed with a plurality of second through holes that are disposed in correspondence to the first through holes, each positioning frame being joined with some of the second through holes and some of the first through holes via a plurality of first lock-fasteners, and a plurality of supporting modules are formed with one side disposed with a plurality of protruding lock-fastening holes and another side having a plurality of ribs horizontally arranged at intervals, each supporting module first penetrating the rest of the second through holes on each positioning frame and the rest of the first through holes on the left and right sides of the container body through these protruding lock-fastening holes and then being fastened to the inner left and right sides via a plurality of second lock-fasteners.

Therefore, according to the objects stated above, the present invention provides a FOUP comprising a container body composed of left side, right side, upper side, and lower side joined together with rear side, an opening opposite to the rear side, a plurality of supporting modules formed on the left and right sides of the container body with each supporting module disposed with a plurality of ribs horizontally arranged at intervals, and a door sized to correspond to the size of the opening and to close the opening, wherein the characteristic of the FOUP is in that: a protruding member is formed on the upper side of the container body, and the upper side of the container body is further disposed with an OHT pad and an OHT head, wherein, the OHT pad is disposed on the upper side of the container body, and a through hole is formed at the center of the OHT pad and a plurality of first studs are formed around the through hole; a round mortise member is formed at the center of the OHT head, and a plurality of protruding second studs are formed around the round mortise member and disposed in correspondence to the first studs; and a plurality of lock-fasteners are disposed for lock-fastening the first studs and the second studs for the joining together the OHT pad and the OHT head; wherein, the round mortise member of the OHT head penetrates the through hole of the OHT pad and then engages with the protruding member on the upper side of the container body.

With the design provided by the present invention, supporting pieces in a large-size FOUP can always be maintained as symmetrical and thus large-sized wafers can be horizontally supported without being damaged; moreover, with the OHT pad, the lifting force of the OHT head exerted on the FOUP is evenly distributed on the FOUP and thus the operation of OHT head can be further stabilized and more weight can be loaded to meet demands of the process.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention discloses a wafer container, and more particularly, a wafer container having calibrated supporting pieces. Wherein, the manufacturing of wafer container and the calibration of through holes are achieved by using current techniques and materials for manufacturing wafer containers, the description of which is thus omitted in the following. Moreover, drawings referred to in the following description are not complete or made according to actual scales and only function to illustrate characteristics of the present invention.

Figure 1:
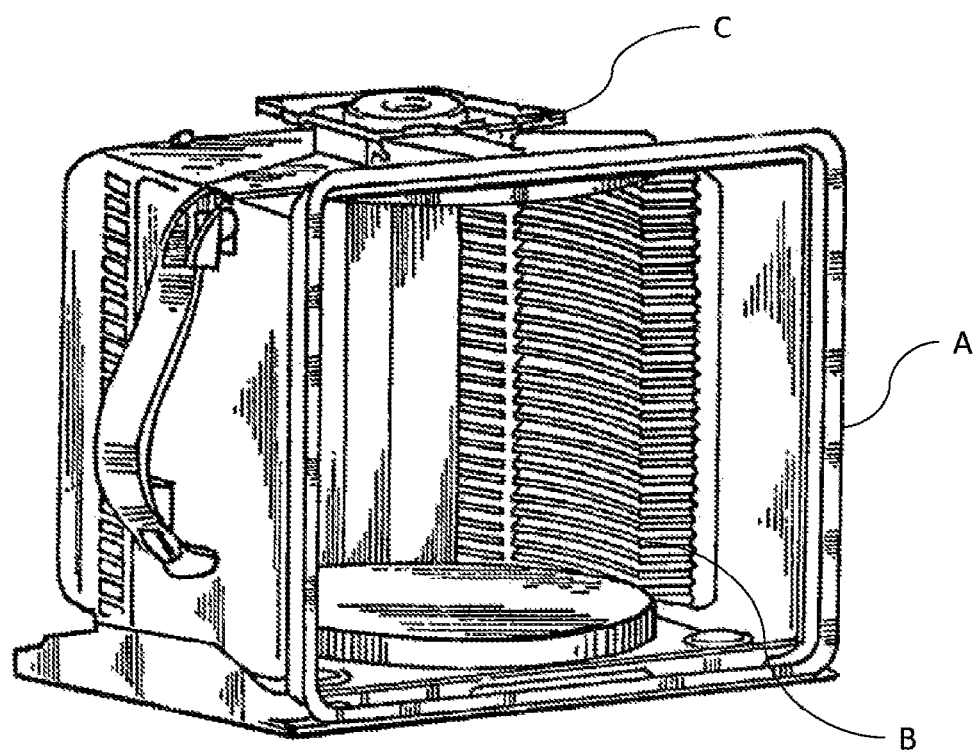
FIG. 1 is a view of a conventional front opening unified pod (FOUP)
Figure 2:
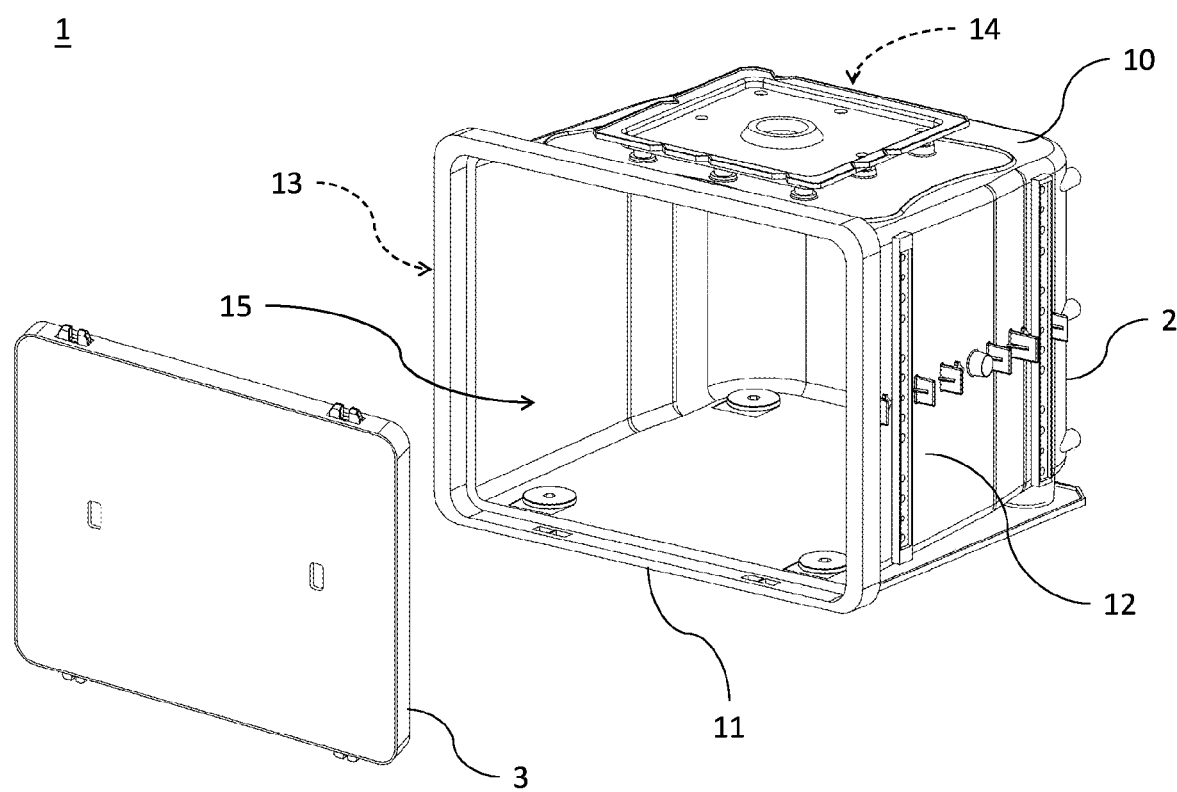
FIG. 2 is a view of the container body of wafer container of the present invention.

First, referring to FIG. 2, which is a view of the container body of wafer container of the present invention. As shown in FIG. 2, the FOUP 1 comprises a container body 2 composed of left side 13, right side 12, upper side 10, and lower side 11 joined with rear side 14 to form an accommodation space, an opening 15 opposite to the rear side 14, and a door 3 sized to correspond to the size of the opening 15 of the container body 2 and to close the opening 15 of the container body 2.

Figure 3:
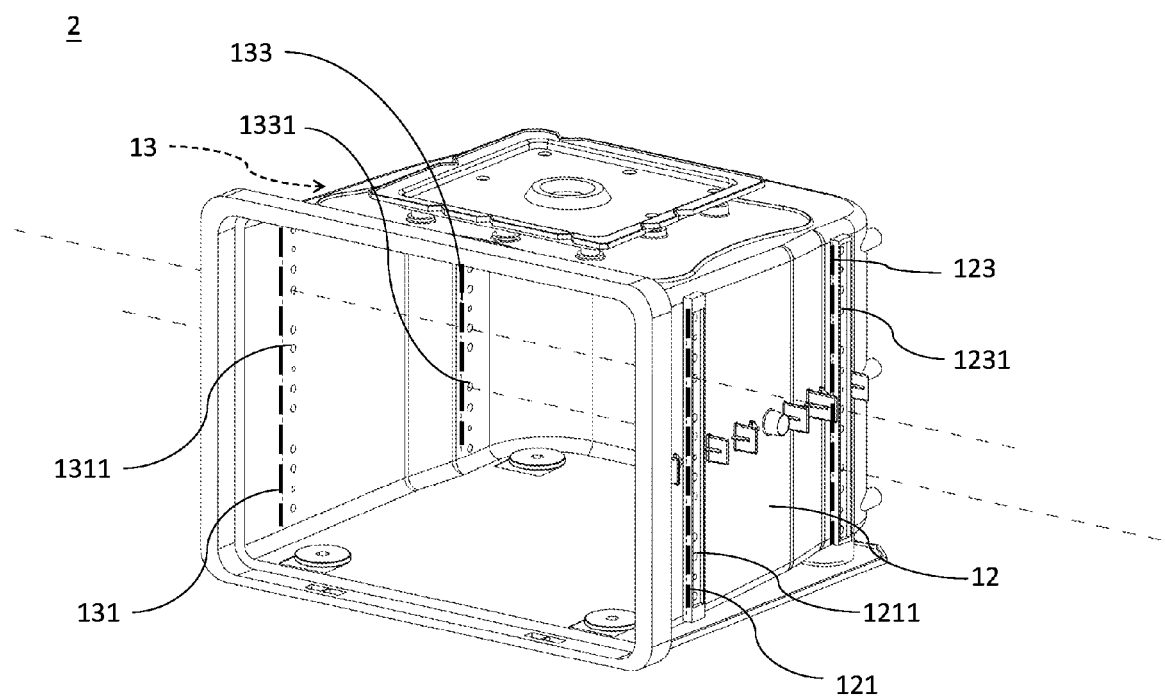
FIG. 3 is a view of the through holes of wafer container of the present invention.

Then, referring to FIG. 3, which is a view of the through holes of wafer container of the present invention. As shown in FIG. 3, when a large-sized FOUP, i.e. a 450 mm FOUP or an even larger FOUP, is manufactured with injection molding, it is more difficult to control the formation of the shape of container body and distortion and deformation may occur. To prevent from deformation that results in asymmetry of supporting pieces (integrated or snap-fitting structure) on two sides of the wafer container, integrated supporting pieces (or snap-fitting structure of supporting pieces) are not formed first in the injection molding process. Instead, the wafer container is first formed by injection molding, and then an additional calibration system such as laser or other high-precision lathe bed apparatus is used to mark out symmetrical positions on the right side 12 and the left side 13 of the container body 2 and drill a plurality of first through holes 1211, 1231, 1311, and 1331 respectively on the right side 12 near the front end 121 and the rear end 123 and on the left right 13 near the front end 131 and the rear end 133. In one embodiment of the present invention, thirteen first through holes 1211, 1231, 1311, and 1331 are respectively drilled on the right side 12 near the front end 121 and the rear end 123 and on the left right 13 near the front end 131 and the rear end 133; the number of drilled holes on each side corresponds precisely (as indicated by dotted lines), which will be described in detail in the following. What is to be emphasized here is that the number of drilled holes is not limited in the present invention and that the embodiment in which thirteen first through holes are drilled as described above is only to concretely illustrate this technical characteristic of the present invention.

Figure 4A:
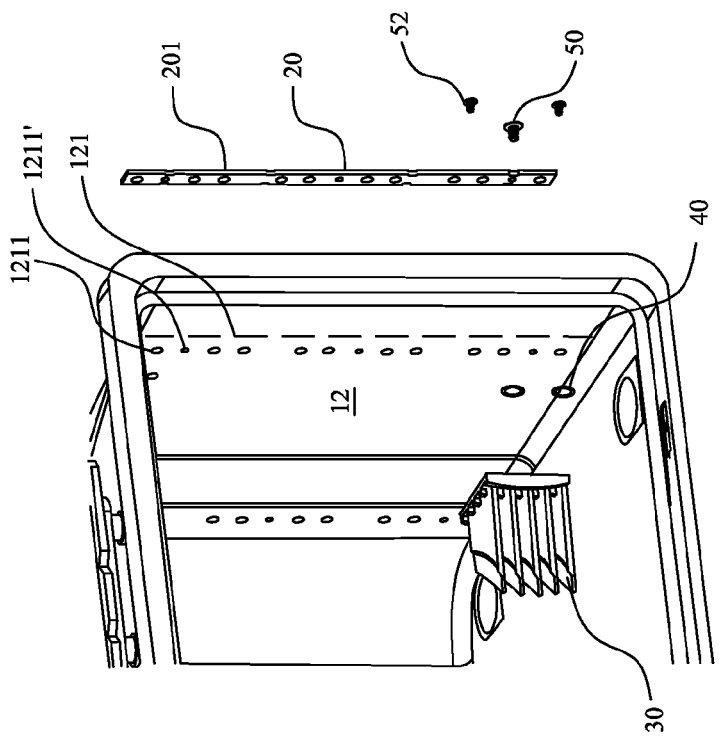
FIG. 4A is a view of the supporting pieces of the present invention being disposed.
Figure 4A:
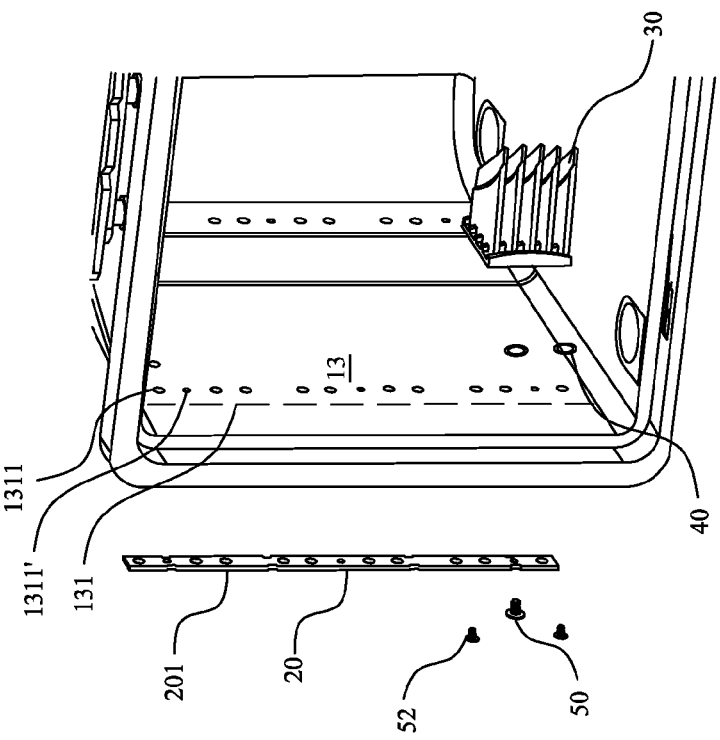

Then, referring to FIG. 4A, which is a view of the supporting pieces of the present invention being disposed. As shown in FIG. 4A, the structure of the front end 121 and the rear end 123 of the right side 12 and the structure of the front end 131 and rear end 133 of the left side 13 are the same, and the first through holes 1211 and 1231 and the first through holes 1311 and 1331 on the left side 13 are also structurally the same, and the method of installing and the structure of supporting pieces 39 are also the same. Therefore, the installation of supporting pieces 30 on the rear end 131 of the left side 13 is used as a representative example and described in the following and the description of installation of supporting pieces on other sides is thus omitted.

Referring then to FIG. 4A, a plurality of first through holes 1311 are disposed near the front end 131 of the left side 13 of the container body 2, wherein, the embodiment of the present invention as described has thirteen first through holes 1311. As shown in FIG. 4A, a positioning frame 20 is formed with a plurality of second through holes 201, and each of the plurality of second through holes 201 is formed and positioned by precise processing; for example, in the embodiment of the present invention, the positioning frame 20 is formed with thirteen second through holes 201, and the second through holes 201 are disposed in correspondence to the first through holes 1311 for the positioning frame 20 to be lock-fastened to the outer side of left side 13 of the container body 2 near the front end 131. In one embodiment, there are in total thirteen first through holes 1311 as described above, and the three first through holes 1311' that are respectively positioned at top, middle, and bottom are to receive the first lock-fasteners 50 that lock-fasten the positioning frame 20. In addition, the material of the positioning frame 20 can be metal or engineering plastic.

Figure 4B:
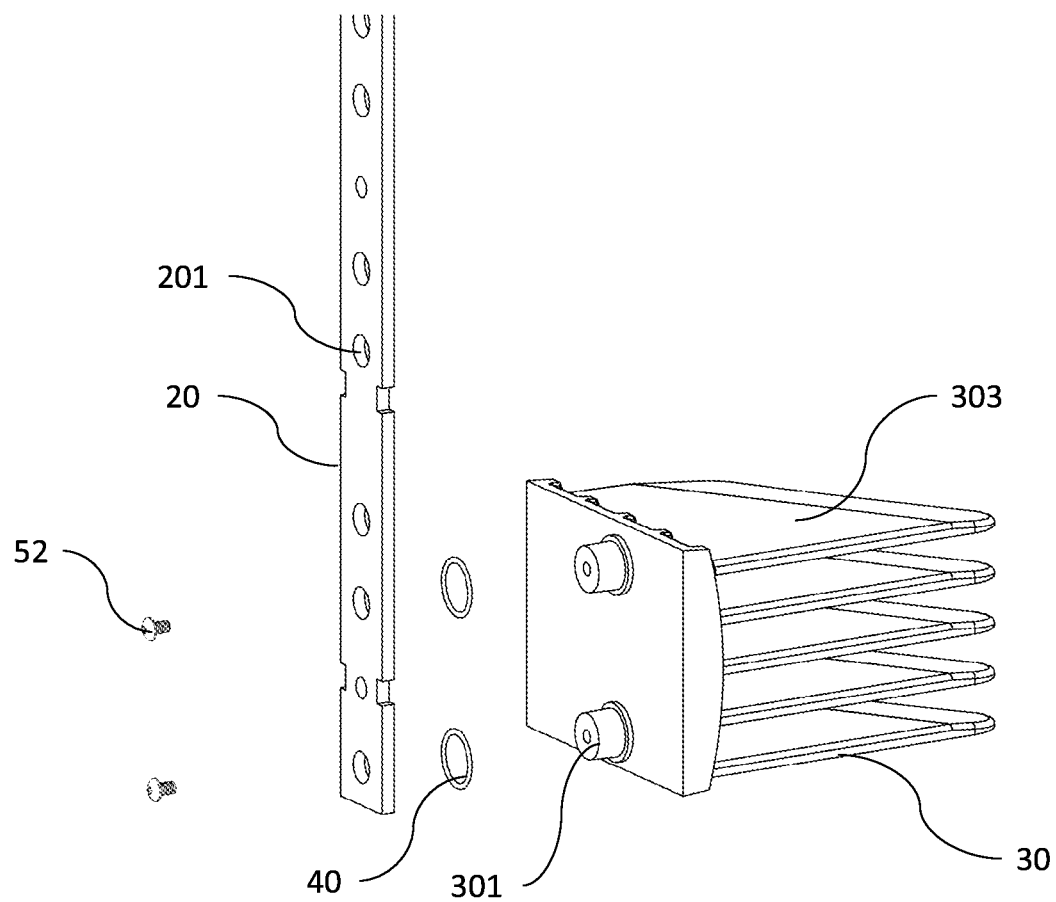
FIG. 4B is a view of the supporting module of the present invention.

Then, referring to FIG. 4B, which is a view of the supporting module of the present invention. As shown in FIG. 4B, the plurality of supporting modules 30 have a plurality of protruding lock-fastening holes 301 formed on one side and a plurality of ribs 303 horizontally arranged at intervals formed on another side. The protruding lock-fastening holes 301 of each supporting module 30 penetrate each of the rest of the second through holes 201 on the positioning frame 20 and each of the rest of the first through holes 1311 at the front end 131 of the left side 13 of the container body 2, and each supporting module 30 is then fastened to the inner left side 13 near the front end 131 with a plurality of second lock-fasteners 52. A seal ring 40 can be further disposed on the lock-fastening holes 301 of each supporting module 30 to achieve air-tightness in the FOUP 1.

In a preferred embodiment of the present invention, each end is respectively disposed with five supporting modules 30, and each of the supporting modules 30 has two lock-fastening holes 301 and five ribs 303; therefore, there are ten lock-fastening holes 301 and twenty-five ribs 303 in total, and the ten lock-fastening holes 301 can be respectively received by the rest of the first through holes 1311 of the container body 2 and the rest of the second through holes 201 on the positioning frame 20. What is to be emphasized here is that the number of the first through holes 1311 and the number of the second through holes 201 are not limited in the present invention, both numbers being determined by the number of the supporting modules 30 disposed and the number of the positioning frames 20 to be lock-fastened. And then, with the four ends, the front end 121 and rear end 123 of the right side 12 and the front end 131 and rear end 133 of the left side 13, being respectively disposed with supporting modules 30, each supporting module 30 corresponding to each of the four ends is loaded with five wafers; apparently, in one preferred embodiment of the present invention, there are five sets (four ends as a set) of supporting modules 30 in the accommodation space in the container body 2, and thus twenty-five wafers in total can be loaded; what is to be emphasized is that the number of wafers placed in the accommodation space in the container body 2 is not limited in the present invention.

Figure 5A:
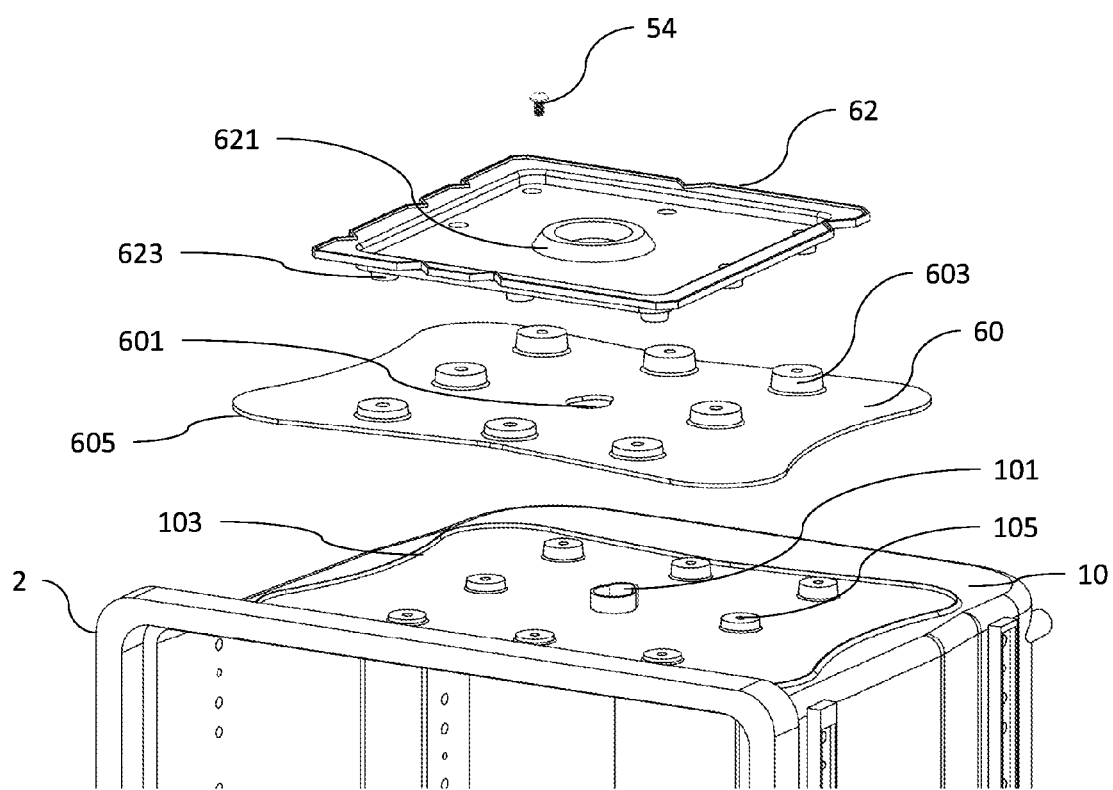
FIG. 5A is a view of the structure of the overhead hoist transport pad (OHT pad) and the overhead hoist transport head (OHT head) of the present invention.

Then, referring to FIG. 5A, which is a view of the structure of the overhead hoist transport pad and the overhead hoist transport head of the present invention, and in the following description, the overhead hoist transport pad will be referred to as "OHT pad" and the overhead hoist transport head will be referred to as "OHT head." As shown in FIG. 5A, a protruding member 101 is formed on the upper side 10 of the container body 2, a ring-shaped snap-fitting groove 103 is formed around the protruding member 101 on the upper side 10, and a plurality of first studs 105 are formed between the snap-fitting groove 103 and the protruding member 101; then, an OHT pad 60 and an OHT head 62 are further disposed on the upper side 10 of the container body 2, wherein, the OHT pad 60 is disposed on the upper side 10 of the container body 2, a through hole 601 is formed at the center of the OHT pad 60, and a plurality of protruding second studs 603 are formed around the through hole 601; the second studs 603 can be in the form of through holes, which is not limited in the present invention. These second studs 603 correspond to the plurality of first studs 105. A snap-fitting piece 605 corresponding to the snap-fitting groove 103 on the upper side 10 can be further formed around the OHT pad 60. Moreover, a round mortise member 621 is formed at the center of the OHT head 62, a plurality of protruding third through holes 623 are formed on one side, and the third through holes 623, the second studs 603, and the first studs 105 are correspondingly disposed. Then, after the round mortise member 621 of the OHT head 62 penetrates the through hole 601 of the OHT pad 60 and then engages with the protruding member 101, the snap-fitting piece 605 of the OHT pad 60 is then snap-fitted to the snap-fitting groove 103 on the upper side 10, the second studs 603 on the OHT pad 60 and the plurality of first studs 105 on the upper side 10 of the container body 2 and the third through holes 623 on the OHT head 62 are aligned, and a plurality of third lock-fasteners 54 are used to lock-fasten the second studs 603 and the third through holes 623 to the plurality of first studs 105 on the upper side 10 of the container body 2 for joining together the OHT pad 60, the OHT head 62, and the upper side 10 of the container body 2.

The primary function of adding the OHT pad 60 in the present invention is to distribute the weight sustained by the OHT head 60 when the robot transports the FOUP. The OHT head of a conventional FOUP is lock-fastened to the wafer container with a plurality of lock-fasteners. Yet as far as a larger-sized FOUP is concerned, with the OHT head lock-fastened to the container body only with a plurality lock-fasteners, it is difficult for the OHT head to sustain the weight of the FOUP and twenty-five wafers placed within when the FOUP is lifted and transported during semiconductor process in the semiconductor fabrication plant. Therefore, with the structure of an OHT pad 60, the present invention is able to distribute the weight of the FOUP and twenty-five wafers placed within sustained by the OHT head. Apparently, the present invention provides a snap-fitting structure comprising the snap-fitting piece 605 of the OHT pad 60 and the snap-fitting groove 103 of the upper side 10 that evenly distributes the weight; with the plurality of protruding second studs 603 on the OHT pad 60 and the plurality of third through holes 623 of the OHT head 62 being lock-fastened together via the third lock-fasteners 54, the OHT head 62 can be more securely lock-fastened to the plurality of first studs 105 on the upper side 10 of the container body 2, and with the round mortise member 621 at the center of the OHT head 62 being disposed in the rear of the center of gravity of the FOUP 1 and the round mortise member 621 being engaged with the protruding member 101 of the upper side 10 of the container body 2, the OHT head 62 can be kept balanced without vibration. In addition, the material of the OHT pad 60 of the present invention can be engineering plastic of high hardness, and more particularly, the hardness of material of the OHT pad 60 is higher than that of the material of the container body.

Figure 5B:
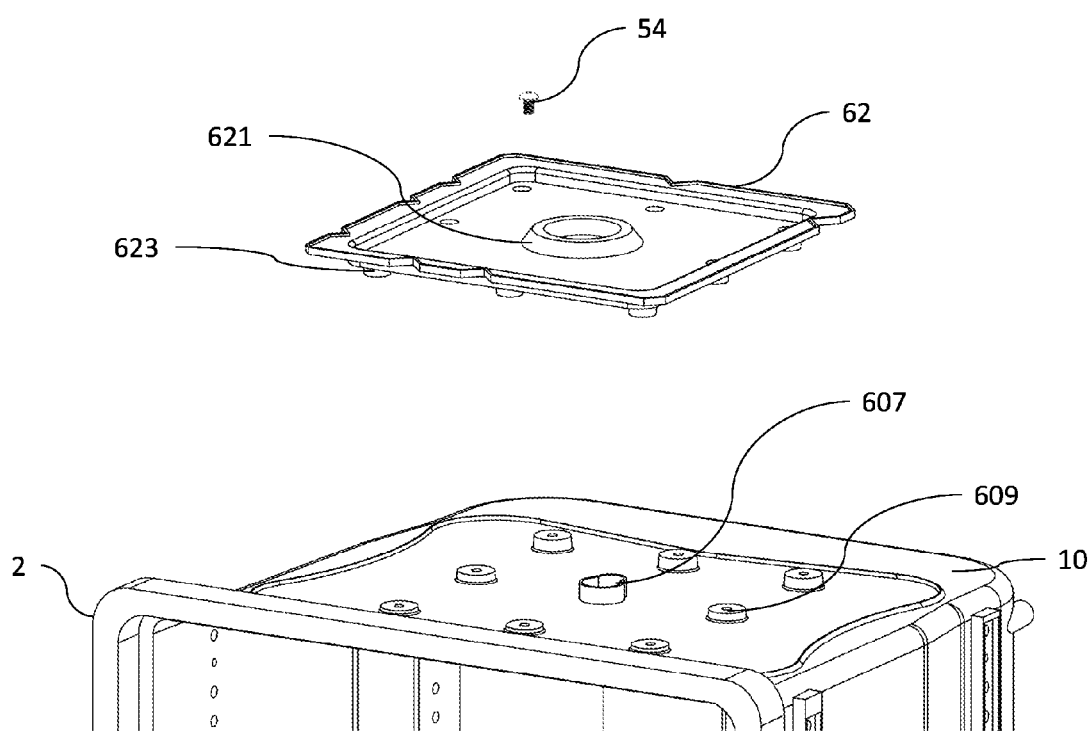
FIG. 5B is a view of the structure of another embodiment of overhead hoist transport pad (OHT pad) of the present invention.

And then, referring to FIG. 5B, which is a view of the structure of another embodiment of OHT pad 60 of the present invention. As shown in FIG. 5B, OHT pad 60 is formed on the upper side 10 of the container body 2 with embedded injection molding, a protruding member 607 is formed at the center of OHT pad 60, and a plurality of protruding undercut mortise members 609 are formed around the protruding member 607; an OHT head 62 is disposed with a round mortise member 621 is formed at the center, and a plurality of protruding third through holes 623 are formed on one side, wherein the third through holes 623 and the undercut mortise members 609 are correspondingly disposed; a plurality of third lock-fasteners 54 are used to lock-fasten the undercut mortise members 609 with the third through holes 623 for joining together the OHT pad 60 and the OHT head 62; wherein, the round mortise member 621 of the OHT head 62 engages the protruding member 607 of the OHT pad 60.

The OHT pad 60 of the present embodiment is formed on the upper side 10 of the container body 2 with embedded injection molding, and thus the design of the snap-fitting piece 605 and the snap-fitting groove 103 as shown in FIG. 5A is not needed. Moreover, as the OHT pad 60 is formed with the container body 2 by embedded injection, the situation in which the OHT pad 60 breaks loose from the container body 2 can be avoided, and such structure can distribute the weight of FOUP and twenty-five wafers sustained by the OHT head more evenly.

Figure 6A:
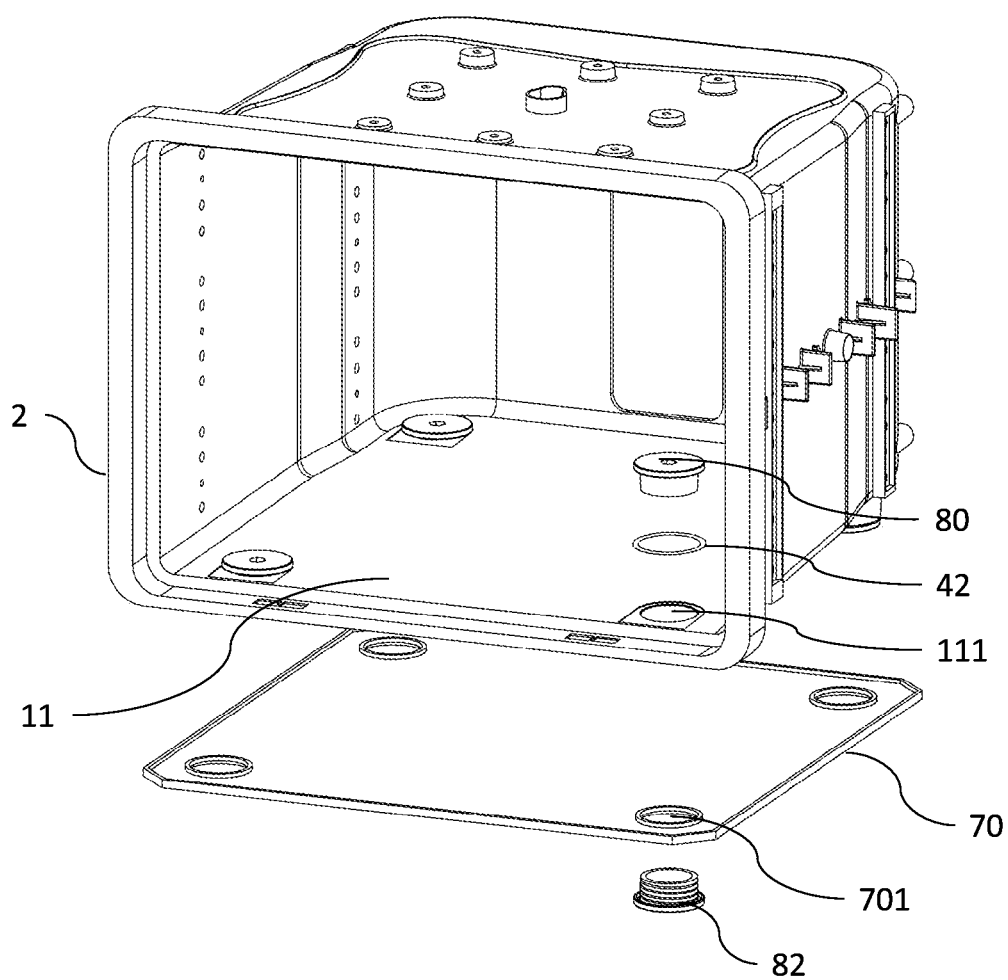
FIG. 6A is a view of the base of the present invention.

Referring to FIG. 6A, which is a view of the base of the present invention. As shown in FIG. 6A, a first ventilation hole 111 is respectively formed at each of the four corners of the lower side 11 of the container body 2, and a base 70 is further disposed below the FOUP 1; wherein, a plurality of second ventilation holes 701 are formed on the base 70, and each of the second ventilation holes 701 and each of the first ventilation holes 111 are correspondingly disposed.

Figure 6B:
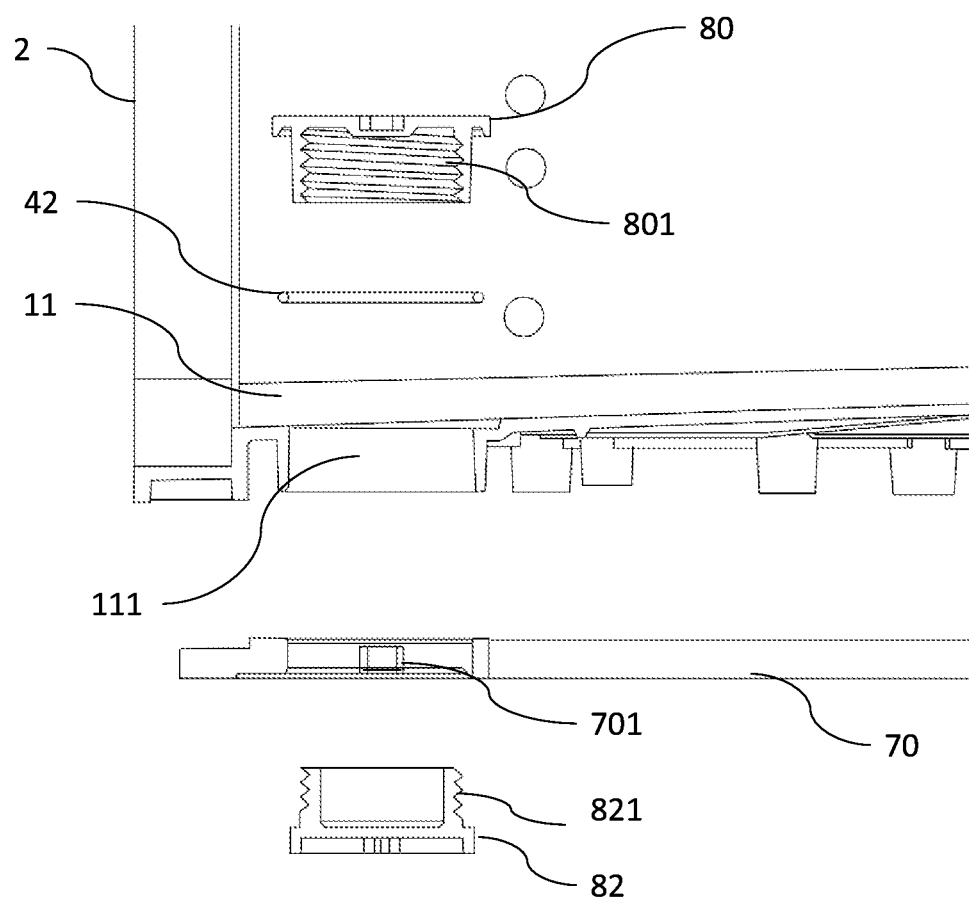
FIG. 6B is a view of the buckling components of the present invention.

Then, referring to FIG. 6B, which is a view of the buckling components of the present invention. As shown in FIG. 6B, a plurality of buckling components comprise first components 80 having inner teeth and second components 82 having outer teeth. The inner teeth 801 of each of the first components 81 penetrate each of the first ventilation holes 111, and the outer teeth 821 of each of the second components 82 penetrate each of the second ventilation holes 701. Therefore, with the inner teeth 801 and the outer teeth 821 being engaged, the first components 81 and the second components 82 are joined for the base 70 and the lower side 11 of the container body 2 to be joined together.

The buckling components of the present invention can also be snap-fitting pieces with a hollow structure, and thus, after the base 70 and the lower side 11 of the container body 2 are joined together via the snap-fitting pieces, the hollow structure is disposed with a purging valve (or an exhausting valve) for the base 70 to be equipped with purging (or exhausting) function after being joined together with the lower side 11 of the FOUP; and a seal ring 42 can be further disposed on each of the first components 80 or the second components 82 to achieve air-tightness in FOUP 1.

Figure 7:
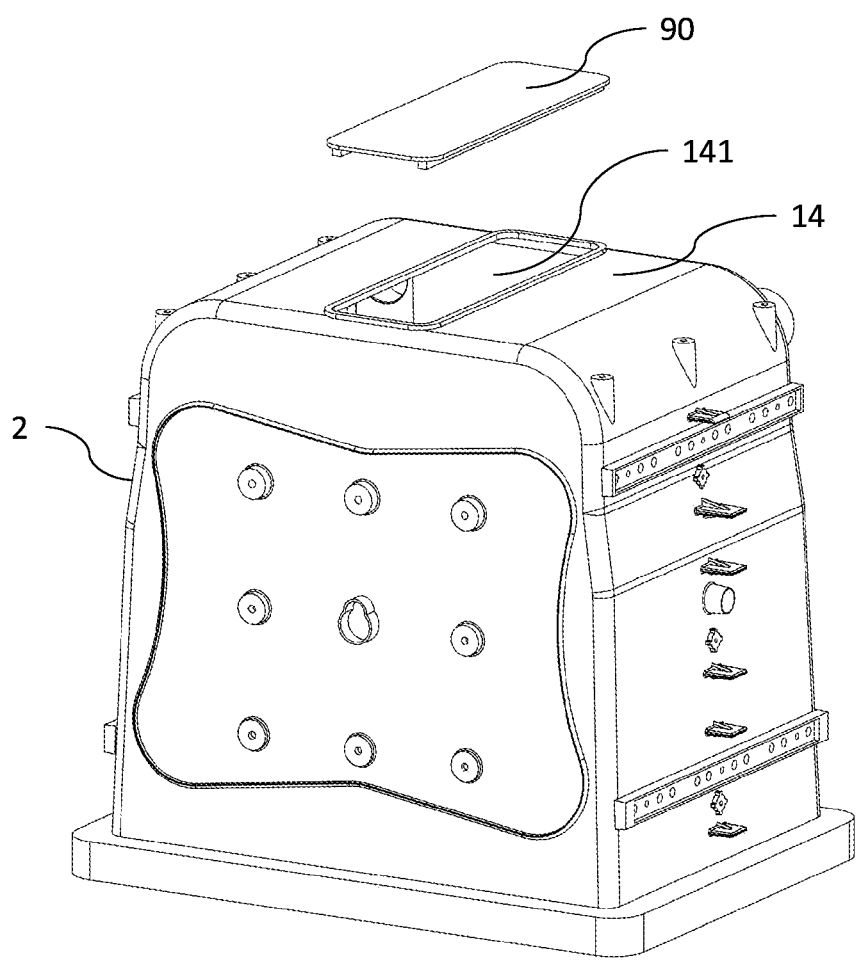
FIG. 7 is a view of the rear side of the present invention.

Referring then to FIG. 7, which is a view of the rear side of the present invention. As shown in FIG. 7, on the rear side 14 of the FOUP of the present invention, a rear opening 141 opposite to the opening 15 can be further formed; an objective of forming this rear opening 141 is to facilitate the calibration and measurement of the semiconductor equipment. And at the rear opening 141, a flat piece 90 can be embedded in the rear opening 141, wherein the flat piece 90 can be transparent or opaque. In one embodiment of the present invention, the flat piece 90 is embedded in the rear opening 141 of the container body 2 via ultrasonic welding; however, the method of embedding or joining the flat piece 90 is not limited in the present invention. Moreover, the material of flat piece 90 of the present invention can be anti-UV engineering plastic material of high cleanliness, and similarly, the material of flat piece 90 is not limited in the present invention. Furthermore, scales and letters such as numbers, process stages, and barcodes can be marked on the transparent flat piece 90 to facilitate the operation of the process.

Figure 8A:
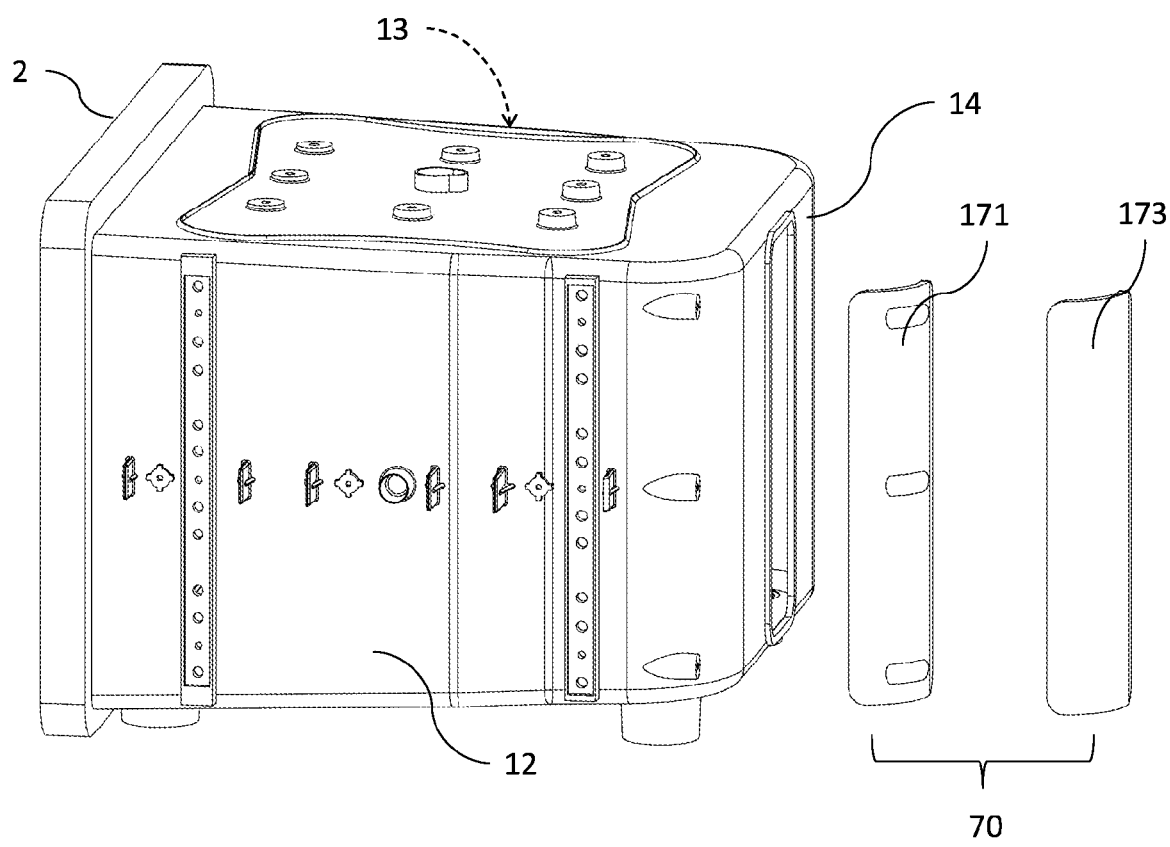
FIG. 8A is a view of the vibration-proof component of the present invention.

Referring to FIG. 8A, which is a view of the vibration-proof component of the present invention. As shown in FIG. 8A, a vibration-proof component 17 is respectively disposed behind the container body 2 of the FOUP 1, on the right side 12 and the left side 13, and at the corners where the two sides join the rear side 14. The vibration-proof component 17 comprises a connecting piece 171 and a vibration-proof pad 173, wherein the connecting piece 171 is fixed to the container body 2 via a lock-fastening structure (not shown in Figure), and the vibration-proof pad 173 is fixed to the connecting piece 171 via a snap-fitting structure (not shown in Figure). The vibration-proof component 17 mainly functions to prevent from collisions during the transportation process. Moreover, when a large-sized FOUP is manually transported, the opening of FOUP faces upward during the transportation process, and thus the vibration-proof pad 173 also offers a non-slip function to ensure that displacement of wafers in the FOUP 1 does not occur due to horizontal carriage movement when the FOUP 1 is transported.

The vibration-proof pad 173 of the vibration component 17 may wear after long-term usage, and therefore the snap-fitting structure (not shown in Figure) fixing the vibration-proof pad 173 to the connecting piece 171 facilitates the replacement of vibration-proof pad 173. What is to be emphasized here is that, the connecting piece 171 in the present embodiment is fixed to the container body 2 via a lock-fastening structure (not shown in Figure) and the vibration-proof pad 173 is fixed to the connecting piece 171 via a snap-fitting structure (not shown in Figure), yet the method for joining and fixing is not limited in the present invention. Moreover, the material of vibration-proof pad 173 in the present embodiment is elastic rubber but is not limited in the present invention and any other material that offers collision-proof and non-slip functions is regarded as within the scope of the present invention.

Figure 8B:
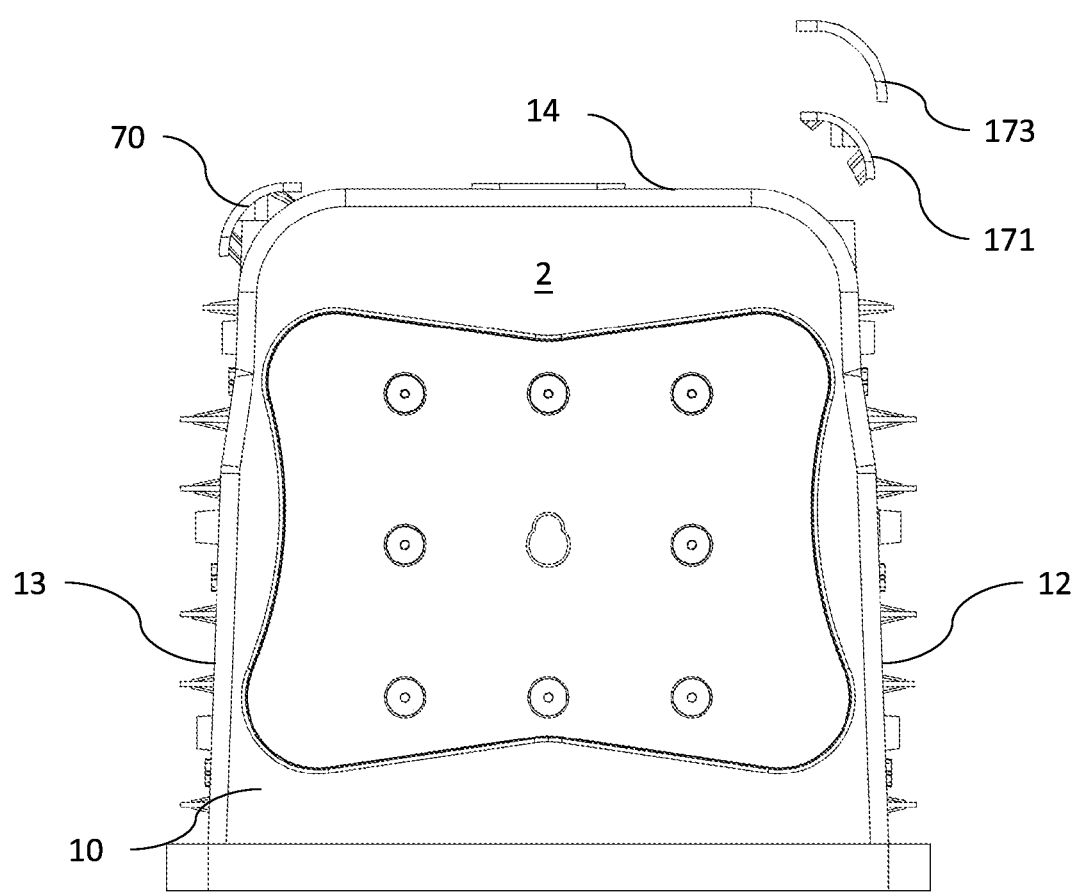
FIG. 8B is a view of the vibration-proof component of the present invention being assembled.

Then, referring to FIG. 8B, which is a view of the vibration-proof component of the present invention being assembled. As shown in FIG. 8B, after the assembly of vibration-proof component 17 is completed, the vibration-proof component 17 protrudes out of the container body 2; therefore, when the container body 2 collides with the floor or a wall, direct contact between the container body 2 and the collided object can be avoided and the wafers within can be protected.

Figure 9:
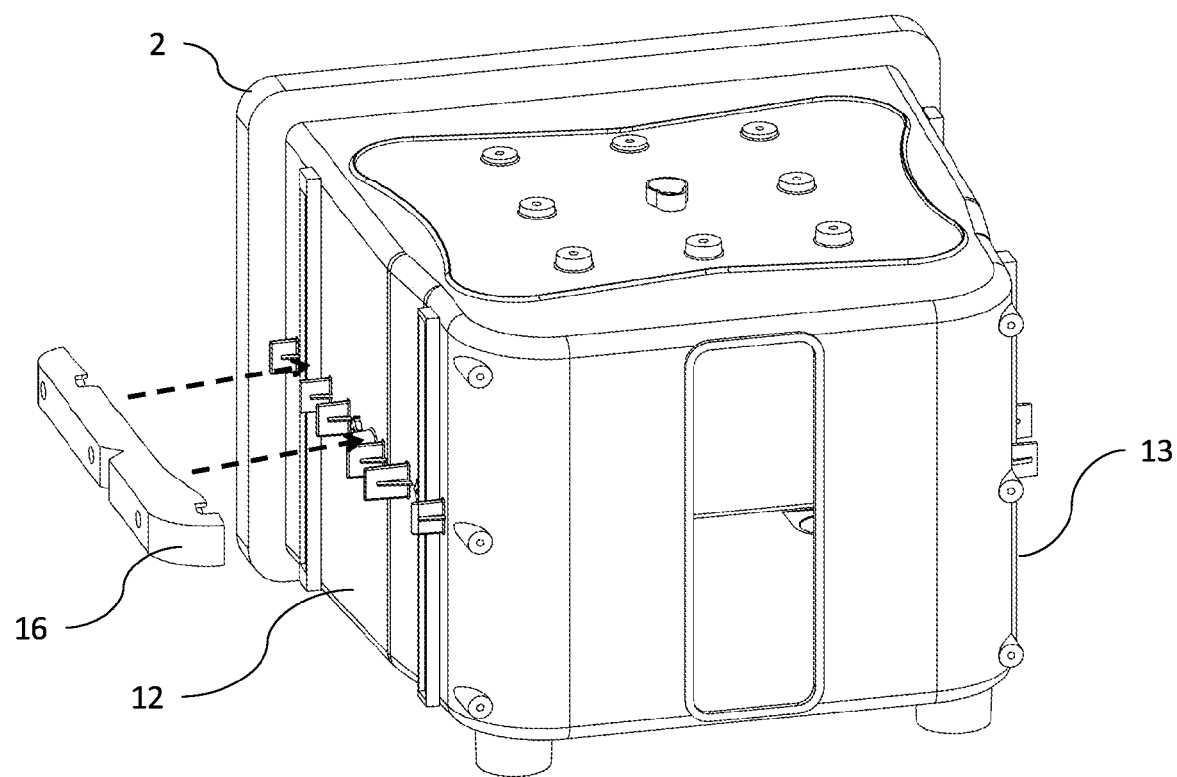
FIG. 9 is a view of the flank portions of the present invention being assembled.

Then, referring to FIG. 9, which is a view of the flank portions of the present invention being assembled. The flank structure is a part of standard structure required by SEMI standards and the function of which is for the robot to move the whole FOUP via the flank structure. As shown in FIG. 9, a flank portion 16 is respectively disposed on the outer side of right side 12 and the outer side of left side 13 for the container body 2 to correspond to SEMI standards. The flank portions 16 are to reinforce the structure of the container body 2 and prevent the container body 2 from deforming due to the stress induced by the material when being formed with one-piece injection molding, so the flank portions 16 are disposed on the outer side of right side 12 and the outer side of left side 13 of the container body 2 after the container body 2 is formed; the assembling method of the flank portions 16 with the container body 2 is not limited in the present invention.

While the invention has been described by way of examples and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A wafer container comprising a container body composed of a left side, a right side, an upper side, and a lower side joined with a rear side for forming an accommodation space in said container body, an opening opposite to said rear side, and a door, sized to a corresponding size of said opening of said container body and to close said opening of said container body, wherein said wafer container is characterized in that:
a plurality of first through holes are formed at front ends and rear ends of said left side and of said right side of said container body;
a plurality of positioning frames are formed with a plurality of second through holes, said plurality of second through holes being disposed in correspondence to said plurality of first through holes, each of said plurality of positioning frames being joined with some of said second through holes and some of said first through holes via a plurality of first lock-fasteners for said plurality of positioning frames to be lock-fastened to outer sides of said left side and said right side; and
a plurality of supporting modules, each of said plurality of supporting modules having a plurality of protruding lock-fastening holes formed on one side surface of each of said plurality of supporting modules, and a plurality of ribs horizontally arranged at intervals formed on another side surface of each of said plurality of supporting modules, said plurality of protruding lock-fastening holes of each of said plurality of supporting modules penetrating through the rest of said plurality of first through holes on said left side and said right side of said container body and through rest of said plurality of second through holes on each of said positioning frames, said plurality of supporting modules being fastened to inner sides of said left side and said right side via a plurality of second lock-fasteners.

2. The wafer container according to claim 1, wherein a protruding member is formed on said upper side of said container body and a plurality of first studs are disposed around said protruding member, an overhead hoist transport pad and an overhead hoist transport head being further disposed on said upper side of said container body, wherein:
said overhead hoist transport pad is disposed on said upper side of said container body, a through hole being formed at a center portion of said overhead hoist transport pad, and a plurality of protruding second studs being formed around said through hole and each of said plurality of second studs being disposed in correspondence to each of said plurality of first studs;
a round mortise member is formed at a center portion of said overhead hoist transport head and a plurality of protruding third through holes are formed around said round mortise member, said plurality of third through holes being disposed in correspondence to said plurality of second studs and said plurality of first studs; and
a plurality of third lock-fasteners are used to lock-fasten said plurality of second studs, said plurality of first studs, and said plurality of third through holes for said overhead hoist transport pad and said overhead hoist transport head to be joined together;
wherein, said round mortise member of said overhead hoist transport head penetrates said through hole of said overhead hoist transport pad, and said round mortise member engages said protruding member of said upper side of said container body.

3. The wafer container according to claim 2, wherein a plurality of snap-fitting grooves are further formed on an outer side of said upper side.

4. The wafer container according to claim 2, wherein a material hardness of said overhead hoist transport pad is higher than a material hardness of said container body.

5. The wafer container according to claim 1, wherein a material of said plurality of positioning frames is an engineering plastic material of high hardness or a metal material.

6. The wafer container according to claim 1, wherein a seal ring is further disposed on each of said plurality of protruding lock-fastening holes on each of said plurality of supporting modules.

7. The wafer container according to claim 1, wherein a rear opening is further formed on said rear side of said wafer container.

8. The wafer container according to claim 1, wherein a first ventilation hole is respectively formed at each of four corners of said lower side of said container body.

9. The wafer container according to claim 1, wherein two vibration-proof components are further disposed behind said container body, on said right side and said left side, and at corners where said two sides join said rear side, said vibration-proof components comprising:
two connecting pieces, disposed at said corners respectively; and
two vibration-proof pads, disposed on said connecting pieces respectively.

10. The wafer container according to claim 1, wherein each of said right side and said left side further includes a flank portion.

11. A wafer container comprising a container body composed of a left side, a right side, an upper side, and a lower side joined with a rear side for forming an accommodation space in said container body, an opening opposite to said rear side, a plurality of supporting modules formed on said left side and said right side of said container body with each of said plurality of supporting modules having a plurality of ribs horizontally arranged at intervals, and a door, sized to a corresponding size of said opening of said container body and to close said opening of said container body, is wherein said wafer container characterized in that:
an overhead hoist transport pad is formed on said upper side of said container body with embedded injection molding and a protruding member is formed at a center portion of said overhead hoist transport pad, a plurality of protruding undercut mortise members being formed around said protruding member;
an overhead hoist transport head is formed with a round mortise member at its center, a plurality of protruding through holes being formed around and on the same side of said round mortise member, said plurality of through holes being disposed in correspondence to said plurality of protruding undercut mortise members; and
a plurality of lock-fasteners are used to lock-fasten said plurality of through holes and said plurality of undercut mortise members for said overhead hoist transport pad and said overhead hoist transport head to be joined together;
wherein, said round mortise member of said overhead hoist transport head engages said protruding member.

12. The wafer container according to claim 11, wherein a material hardness of said overhead hoist transport pad is higher than a material hardness of said container body.

13. The wafer container according to claim 11, wherein a rear opening is further formed on said rear side of said wafer container.

14. The wafer container according to claim 11, wherein a first ventilation hole is respectively formed at each of four corners of said lower side of said container body.

15. The wafer container according to claim 11, wherein two vibration-proof components are further disposed behind said container body, on said right side and said left side, and at corners where said two sides join said rear side, said vibration-proof components comprising:
   two connecting pieces, disposed at said corners respectively; and
   two vibration-proof pads, disposed on said connecting pieces respectively.

16. The wafer container according to claim 11, wherein each of said right side and said left side further includes a flank portion.

17. A wafer container comprising a container body composed of a left side, a right side, an upper side, and a lower side joined with a rear side for forming an accommodation space in said container body, an opening opposite to said rear side, a plurality of supporting modules formed on said left side and said right side of said accommodation space in said container body with each of said plurality of supporting modules having a plurality of ribs horizontally arranged at intervals, and a door, sized to a corresponding size of said opening of said container body and to close said opening of said container body, wherein said wafer container is characterized in that:
   a protruding member is formed on said upper side of said container body and a plurality of first studs are disposed around said protruding member, an overhead hoist transport pad and an overhead hoist transport head being further disposed on said upper side of said container body, wherein, said overhead hoist transport pad is disposed on said upper side of said container body and a through hole is formed at a center portion of said overhead hoist transport pad, a plurality of protruding second studs being formed around said through hole and each of said plurality of second studs being disposed in correspondence to each of said plurality of first studs;
   a round mortise member is formed at a center portion of said overhead hoist transport head and a plurality of protruding through holes are formed around said round mortise member, said plurality of through holes being disposed in correspondence to said plurality of second studs and said plurality of first studs; and
   a plurality of lock-fasteners are used to lock-fasten said plurality of second studs, said plurality of first studs, and said plurality of through holes for said overhead hoist transport pad and said overhead hoist transport head to be joined together;
   wherein, said round mortise member of said overhead hoist transport head penetrates said through hole of said overhead hoist transport pad, and said round mortise member engages said protruding member of said upper side of said container body.

18. The wafer container according to claim 17, wherein a material hardness of said overhead hoist transport pad is higher than a material hardness of said container body.

19. The wafer container according to claim 17, wherein a rear opening is further formed on said rear side of said wafer container.

20. The wafer container according to claim 19, wherein said rear opening further includes a transparent piece embedded in said rear opening.

21. The wafer container according to claim 17, wherein a plurality of snap-fitting grooves are further formed on an outer side of said upper side.

22. The wafer container according to claim 17, wherein a first ventilation hole is respectively formed at each of four corners of said lower side of said container body.

23. The wafer container according to claim 22, further comprising a base, wherein, a plurality of second ventilation holes are formed on said base, each of said plurality of second ventilation holes being disposed in correspondence to each of said plurality of first ventilation holes; and
   a plurality of buckling components are formed, each of which comprising a first component having inner teeth and a second component having outer teeth;
   wherein, said inner teeth of each of said first components penetrate each of said first ventilation holes, and said outer teeth of each of said second components penetrate each of said second ventilation holes, with said inner teeth and said outer teeth being engaged, said first components and said second components being joined for said base and said lower side of said container body to be joined together.

24. The wafer container according to claim 23, wherein a seal ring is further disposed on said inner teeth of each of said first components or on said outer teeth of each of said second components.

25. The wafer container according to claim 22, further comprising a base, wherein,
   a plurality of second ventilation holes are formed on said base, each of said plurality of second ventilation holes being disposed in correspondence to each of said plurality of first ventilation holes; and
   a plurality of purging valves are formed, each of said plurality of purging valves comprising a purging head and a fixed member, a center portion of each of said purging heads being formed with a hollow cylindrical portion protruding upward and inner teeth being formed on a peripheral wall of said hollow cylindrical portion, each of said fixed members having a fixed base and a hollow cylindrical portion protruding upward being formed on said fixed base, outer teeth being formed on peripheral wall of said hollow cylindrical portion; wherein, said inner teeth of each of said purging heads penetrate each of said first ventilation holes, and said outer teeth of each of said fixed members penetrate each of said second ventilation holes, without said inner teeth and said outer teeth being engaged, said purging heads and said fixed members being joined for said base and said lower side of said container body to be joined together.

26. The wafer container according to claim 25, wherein a seal ring is further disposed on said inner teeth of said purging heads or on said outer teeth of said fixed members.

27. A wafer container comprising a container body composed of a left side, a right side, an upper side, and a lower side joined with a rear side for forming an accommodation space in said container body, an opening opposite to said rear side, a plurality of supporting modules formed on said left side and said right side of said container body with each of said plurality of supporting modules having a plurality of ribs horizontally arranged at intervals, and a door, sized to a corresponding size of said opening of said container body and to close said opening of said container body, wherein said wafer container is characterized in that:

each of said plurality of supporting modules is formed by a first material, and each of said plurality of supporting modules, which having said first material, is lock-fastened to an inner side surface of one side of said container body via a positioning frame made of a second material.

28. The wafer container according to claim 27, wherein a protruding member is formed on said upper side of said container body, and an overhead hoist transport pad and an overhead hoist transport head are further disposed on said upper side of said container body, wherein,
    said overhead hoist transport pad is disposed on said upper side of said container body and a through hole is formed at a center portion of said overhead hoist transport pad, a plurality of protruding studs being formed on one side;
    a round mortise member is formed at a center portion of said-overhead hoist transport head and a plurality of protruding through holes are formed on one side, said plurality of through holes being disposed in correspondence to said plurality of studs; and
    a plurality of third lock-fasteners are used to lock-fasten said plurality of studs and said plurality of through holes for said overhead hoist transport pad and said overhead hoist transport head to be joined together;
    wherein, said round mortise member of said overhead hoist transport head penetrates said through hole of said-overhead hoist transport pad, and said round mortise member engages said protruding member.

29. The wafer container according to claim 27, wherein a material of said positioning frames is polymer material of high hardness or metal material.

30. The wafer container according to claim 29, wherein a material hardness of an overhead hoist transport pad is higher than a material hardness of said container body.

31. The wafer container according to claim 29, wherein an overhead hoist transport pad is further disposed with a plurality of snap-fitting pieces corresponding to plurality of snap-fitting grooves.

32. The wafer container according to claim 31, wherein two vibration-proof components are further disposed behind said container body, on said right side and said left side, and at corners where said two sides join said rear side, said vibration-proof components comprising:
    two connecting pieces, disposed at said corners respectively; and
    two vibration-proof pads, disposed on said connecting pieces respectively.

33. The wafer container according to claim 27, wherein each of said right side and said left side further includes a flank portion.

* * * * *